United States Patent
Horiuchi

(10) Patent No.: US 9,585,286 B2
(45) Date of Patent: Feb. 28, 2017

(54) AIR-COOLED CASE

(71) Applicant: NEC Platforms, Ltd., Kanagawa (JP)

(72) Inventor: Hisashi Horiuchi, Kanagawa (JP)

(73) Assignee: NEC PLATFORMS, LTD., Kanagawa (JP)

( * ) Notice: Subject to any disclaimer, the term of this patent is extended or adjusted under 35 U.S.C. 154(b) by 150 days.

(21) Appl. No.: 14/397,077

(22) PCT Filed: Apr. 16, 2013

(86) PCT No.: PCT/JP2013/061237
§ 371 (c)(1),
(2) Date: Oct. 24, 2014

(87) PCT Pub. No.: WO2013/161617
PCT Pub. Date: Oct. 31, 2013

(65) Prior Publication Data
US 2015/0109733 A1    Apr. 23, 2015

(30) Foreign Application Priority Data
Apr. 26, 2012   (JP) ................................ 2012-101619

(51) Int. Cl.
*H05K 7/20*   (2006.01)

(52) U.S. Cl.
CPC ..... *H05K 7/20136* (2013.01); *H05K 7/20618* (2013.01)

(58) Field of Classification Search
CPC ........................ H05K 7/20136; H05K 7/20618
See application file for complete search history.

(56) References Cited

U.S. PATENT DOCUMENTS

| | | | |
|---|---|---|---|
| 5,793,610 A * | 8/1998 | Schmitt | H05K 7/20581 165/80.3 |
| 6,181,557 B1 * | 1/2001 | Gatti | H05K 7/20618 165/122 |
| 6,362,960 B1 * | 3/2002 | Ducourt | H05K 7/20172 361/695 |

(Continued)

FOREIGN PATENT DOCUMENTS

| | | |
|---|---|---|
| CN | 101225987 | 7/2008 |
| JP | 59-161695 | 10/1984 |

(Continued)

OTHER PUBLICATIONS

Extended European search report, dated Nov. 5, 2015; Application No. 13780794.7.

(Continued)

*Primary Examiner* — Courtney Smith
*Assistant Examiner* — Matt Dhillon
(74) *Attorney, Agent, or Firm* — Young & Thompson

(57) ABSTRACT

An air-cooled case enabling automatic setting of a flow of cooling air during natural cooling and during forced cooling contains a heating element and a cooling fan in a space surrounded by multiple surfaces that include a top surface and mutually facing side surfaces. The air-cooled case is provided with a top surface ventilation opening formed in the top surface, side surface ventilation openings formed in the side surfaces, and a shutter that is provided in the top surface ventilation opening and opens/closes the top surface ventilation opening.

8 Claims, 6 Drawing Sheets

(56) References Cited

U.S. PATENT DOCUMENTS

| | | | |
|---|---|---|---|
| 6,688,965 B1* | 2/2004 | Crippen | H05K 7/20181 361/695 |
| 7,416,481 B2* | 8/2008 | Baker | F04D 25/14 361/679.48 |
| 7,740,054 B2* | 6/2010 | Yang | H01L 23/427 165/104.33 |
| 8,408,981 B2* | 4/2013 | Su | F04D 29/441 165/104.34 |
| 8,534,988 B2* | 9/2013 | Zhang | F04D 25/0613 415/211.2 |
| 8,572,430 B2* | 10/2013 | Nakamura | G11B 33/142 361/679.33 |
| 8,934,243 B2* | 1/2015 | Ito | G06F 1/203 361/679.48 |
| 2009/0231809 A1* | 9/2009 | Koide | G06F 1/206 361/697 |
| 2009/0321047 A1* | 12/2009 | Chen | G06F 1/203 165/80.3 |
| 2011/0159795 A1 | 6/2011 | Sprague et al. | |
| 2013/0027880 A1* | 1/2013 | Ito | G06F 1/203 361/697 |

FOREIGN PATENT DOCUMENTS

| | | |
|---|---|---|
| JP | 05-036497 | 2/1993 |
| JP | 05-67137 | 9/1993 |
| JP | 08-280106 | 10/1996 |
| JP | 10-161510 | 6/1998 |
| JP | 2002-277954 | 9/2002 |
| JP | 2010-026381 | 2/2010 |
| WO | WO 03/067949 | 8/2003 |

OTHER PUBLICATIONS

International Search Report, PCT/JP2013/061237, Jun. 25, 2013.
Chinese Official Action—201380022389.3—Apr. 5, 2016.

* cited by examiner

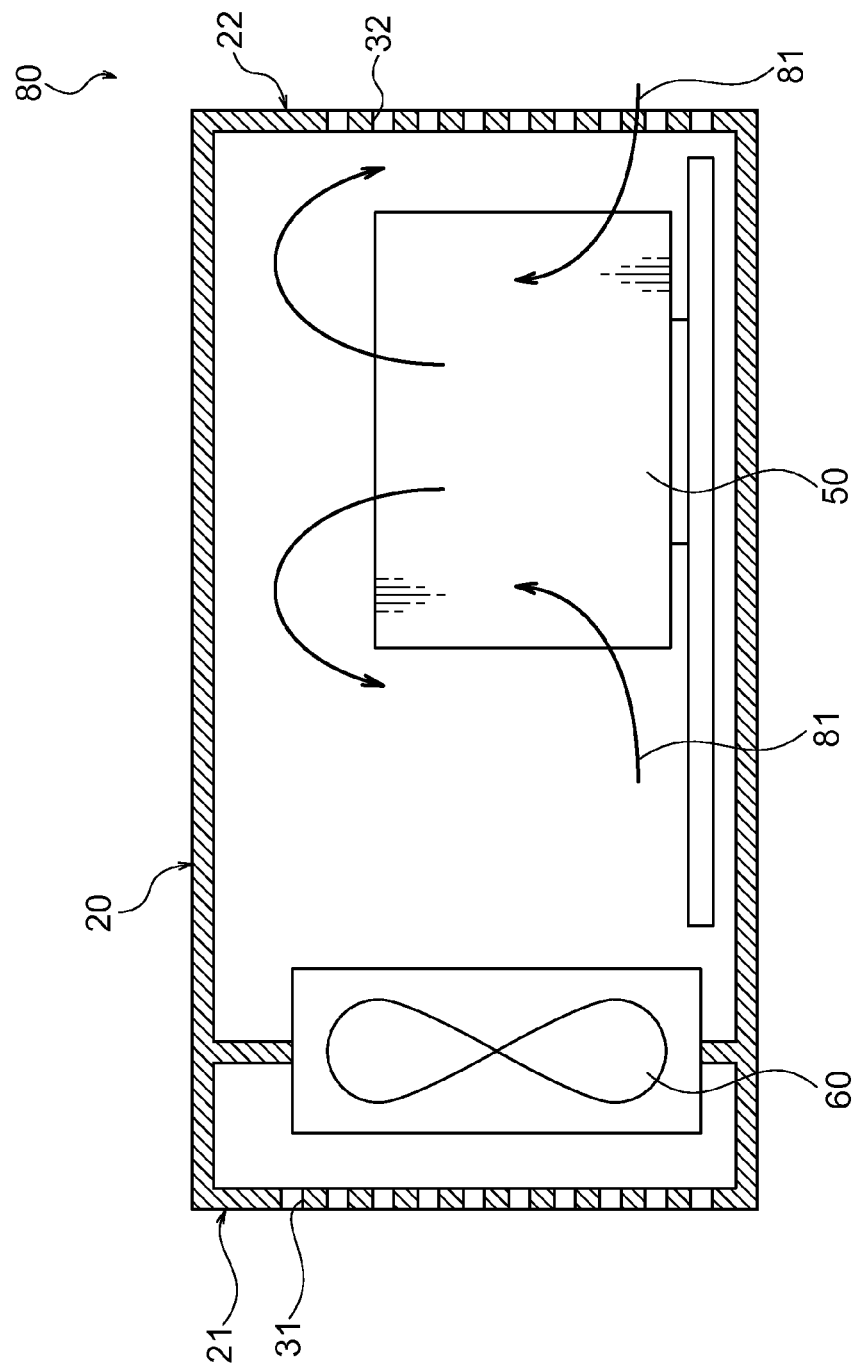

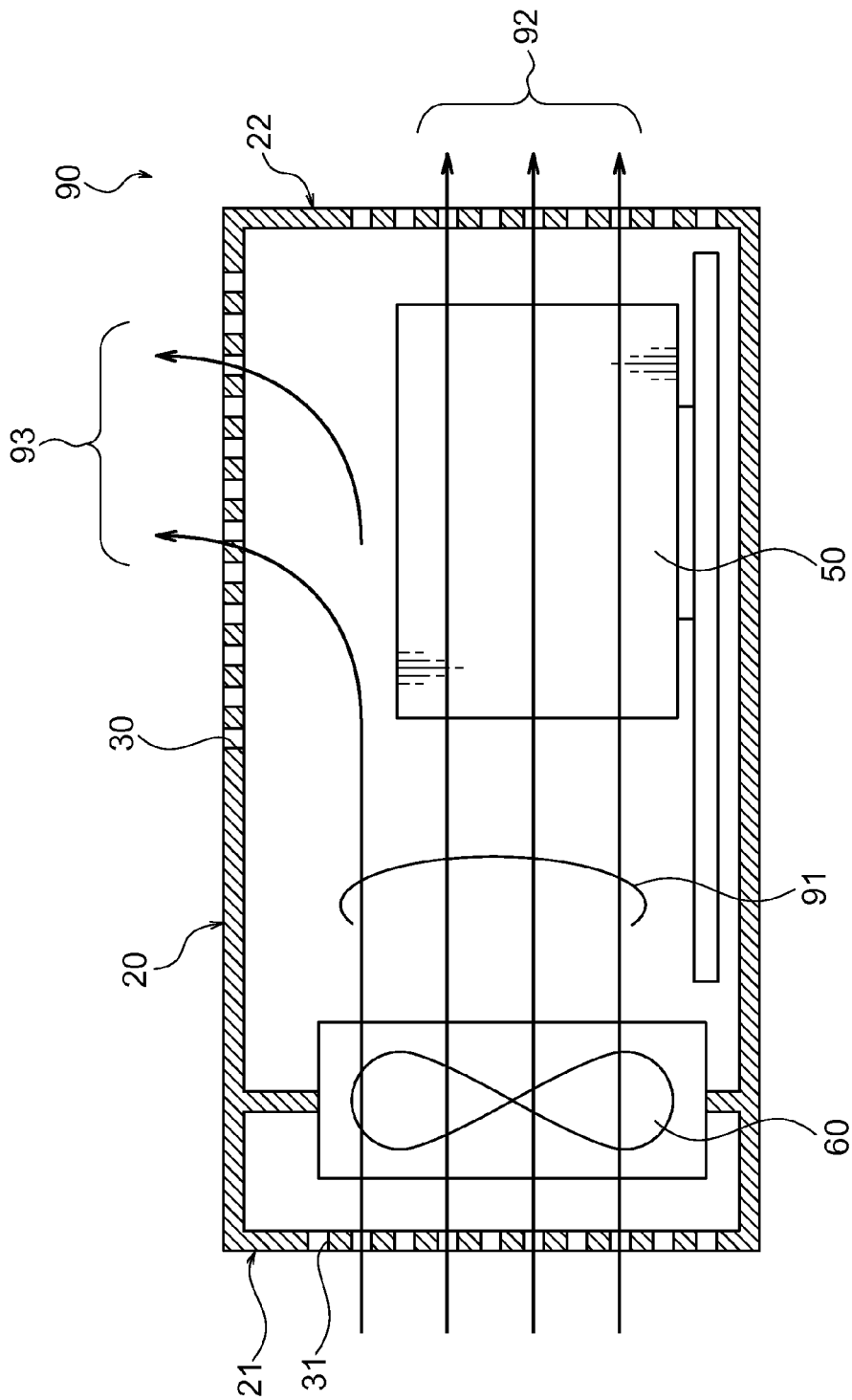

AIR-COOLED CASE

TECHNICAL FIELD

The present invention relates to a case used for information processors and the like. More specifically, the present invention relates to an air-cooled case with a built-in cooling fan.

BACKGROUND ART

The power consumption of an air-cooled case can be suppressed through performing natural cooling by stopping a cooling fan in a case of low heat generation and performing forced cooling by driving the cooling fan in a case of high heat generation. In that case, the cooling capacity is lost unless the flow of cooling air is set to be suited for each of the cases of natural cooling and forced cooling. The air-cooled case depicted in Patent Document 1 is capable of setting the flow of cooling air either for the case of natural cooling or for the case of forced cooling by changing metal fittings.

In the meantime, Patent Document 2 discloses: an opening part formed on the side surface of a case; a louver which opens the opening part by its weight and closes the opening part by an air pressure from a cooling fan; and a louver which closes the opening part by its weight and opens the opening part by the air pressure from the cooling fan. Those louvers work to close the opening part for not producing a noise when it is unnecessary to let in the outside air.

Patent Document 3 discloses: Two opening parts formed on the side surfaces of a wind tunnel; and an evacuation movable plate and an aspiration movable plate for opening and closing each of those opening parts. Further, the evacuation movable plate automatically closes the opening part by a negative pressure at the time of operating a push-in fan, and the aspiration movable plate automatically closes the opening part by a negative pressure at the time of operating an intake fan. The evacuation movable plate and the aspiration movable plate have improved the reliability by generating a same flow of air in the wind tunnel both when operating the push-in fan and when operating the in-take fan so as to be able to deal with a case where one of the fans breaks down.

Patent Document 4 discloses an aspiration path opening/closing member which is provided on an aspiration path for opening/closing the aspiration path. The aspiration path opening/closing member is formed by a flexible film, which normally opens the aspiration path to let in the outside air and closes the aspiration path by an air pressure when operating an evacuation fan to suppress leak of the noise of the evacuation fan.

Patent Document 1: Japanese Unexamined Patent Publication 2000-277954 (Abstract)

Patent Document 2: Japanese Unexamined Patent Publication 2010-026381 (Paragraphs 0018, 0019, 0026, 0027, FIG. 2, FIG. 4)

Patent Document 3: Japanese Unexamined Patent Publication Hei 08-280106 (Paragraphs 0008 to 0011, FIG. 1, FIG. 2)

Patent Document 4: Japanese Unexamined Patent Publication Hei 10-161510 (Paragraph 0012 FIG. 5)

However, while the technique depicted in Patent Document 1 is capable of setting the flow of cooling air either for the case of natural cooling or for the case of forced cooling, it is extremely troublesome since the metal fittings need to be changed by hands.

Further, the techniques depicted in Patent Documents 2 to 4 are designed to reduce the noise or to improve the reliability. Thus, there are large differences in the techniques, and the issue in the technique depicted in Patent Document 1 cannot be overcome with those.

It is therefore an object of the present invention to provide an air-cooled case which is capable of automatically setting a flow of cooling air for each of the cases of natural cooling and forced cooling.

DISCLOSURE OF THE INVENTION

The air-cooled case according to the present invention is an air-cooled case which houses a heating element and a cooling fan in a space surrounded by a plurality of surfaces including a top surface, and the air-cooled case is characterized to include: a top surface ventilation opening formed in the top surface; ventilation openings formed in some of the plurality of surfaces; and a shutter which is provided in the top surface ventilation opening and opens/closes the top surface ventilation opening, wherein the shutter opens the top surface ventilation opening by its own weight when there is no forced cooling air generated by the cooling fan, and closes the top surface ventilation opening by a pressure of the forced cooling air when there is the forced cooling air.

It is possible with the present invention to automatically set a flow of cooling air suited for the case of natural cooling by opening the top surface ventilation opening by the shutter itself in the case of natural cooling and to automatically set a flow of cooling air suited for the case of forced cooling by closing the top surface ventilation opening by the shutter itself in the case of forced cooling.

BRIEF DESCRIPTION OF THE DRAWINGS

FIG. 5 is a sectional view showing an air-cooled case according to a related technique 1; and FIG. 6 is a sectional view showing an air-cooled case according to a related technique 2.

BEST MODES FOR CARRYING OUT THE INVENTION

Figure 1:
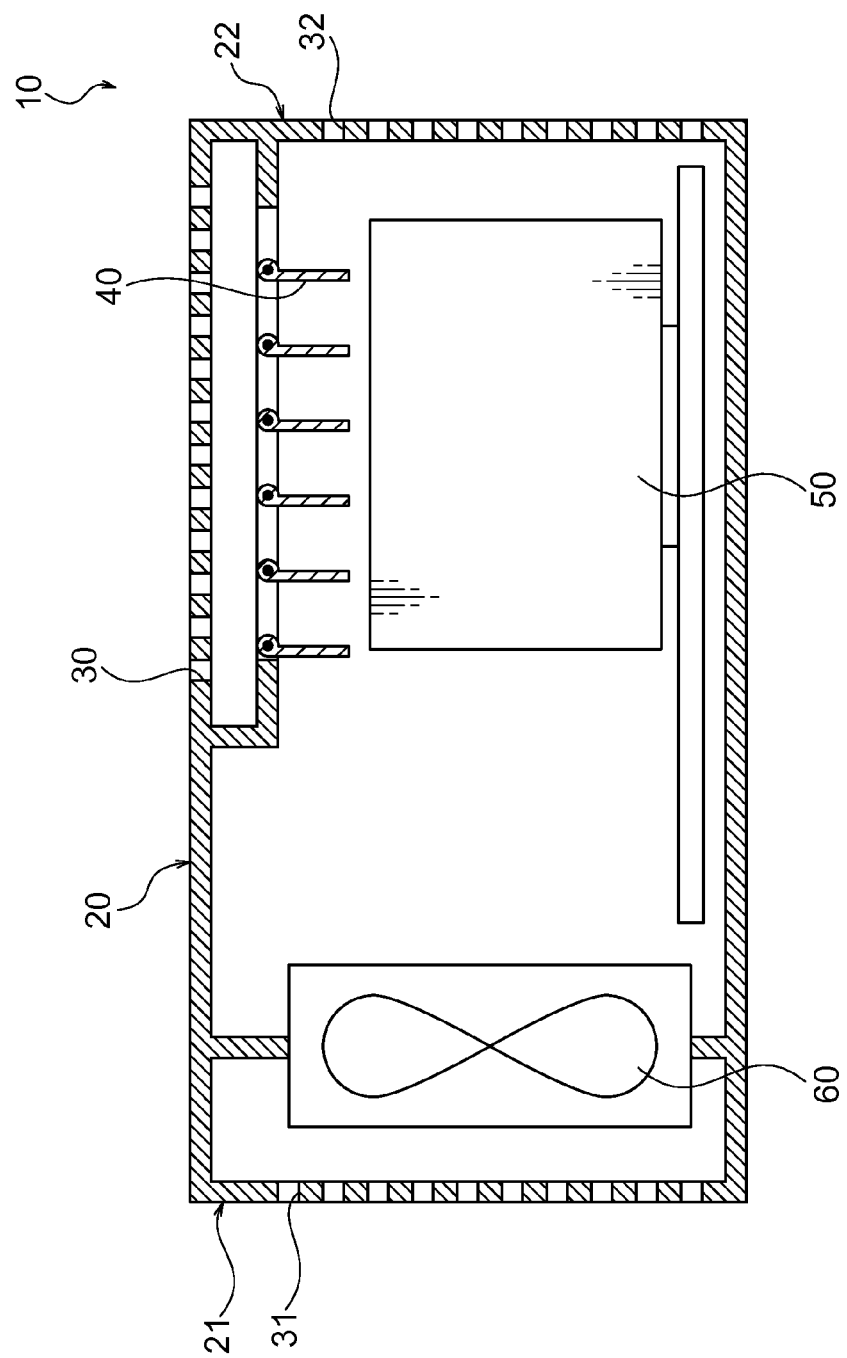
FIG. 1 is a sectional view showing an air-cooled case according to a first exemplary embodiment.

Hereinafter, the related techniques as the premise of the present invention and modes (referred to as "embodiments" hereinafter) for embodying the present invention will be described by referring to the accompanying drawings. In the Description and the drawings, same reference numerals are used for substantially same structural elements. Shapes presented in the drawings are drawn in such a manner to be easily comprehended by those skilled in the art, so that sizes and ratios thereof are not necessarily consistent with those of the actual ones.

First, the related techniques as the premise of the present invention will be described.

FIG. 5 is a sectional view showing an air-cooled case of the related technique 1. Hereinafter, explanations will be provided by referring to the drawings.

An air-cooled case 80 of the related technique 1 houses a heating element 50 and a cooling fan 60 in a space surrounded by a plurality of surfaces including a top surface 20 and opposing side surfaces 21, 22. Further, the air-cooled case 80 includes side surface ventilation openings 31, 32 formed in the side surfaces 21, 22. When the cooling fan 60 is stopped, the air-cooled case 80 is in a natural cooling state. In the natural cooling state, a natural cooling air 81 enters from the side surface ventilation openings 31, 32 to cool the heating element 50.

However, there is such an issue with the air-cooled case 80 that the cooling capacity is low at the time of natural cooling, i.e., the temperature of the heating element 50 is hard to be lowered at the time of natural cooling. It is because the heat generated by the heating element 50 at the time of natural cooling is not easily discharged to the outside from the air-cooled case 80 so that it tends to persist inside the air-cooled case 80. That is, it is because a following flow is repeated in the natural cooling state: the natural cooling air 81 entered from the side surface ventilation openings 31, 32 is heated by the heating element 50 and moves upwards; the air moves downwards by abutting against the top surface 20; and the air is again heated by the heating element 50 and moves upwards.

FIG. 6 is a sectional view showing an air-cooled case of the related technique 2. Hereinafter, explanations will be provided by referring to the drawing.

An air-cooled case 90 of the related technique 2 houses a heating element 50 and a cooling fan 60 in a space surrounded by a plurality of surfaces including a top surface 20 and opposing side surfaces 21, 22. Further, the air-cooled case 90 includes a top surface ventilation opening 30 formed in the top surface 20 in addition to side surface ventilation openings 31, 32 formed in the side surfaces 21, 22. In the natural cooling state, a natural cooling air 81 entered from the side surface ventilation openings 31, 32 is heated by the heating element 50 and moves upwards, and then it is discharged to the outside from the top surface ventilation opening 30.

However, there is such an issue with the air-cooled case 90 that the cooling capacity is low at the time of natural cooling, i.e., the temperature of the heating element 50 is hard to be lowered at the time of natural cooling. The reason is follows. Out of a forced cooling air 91 generated by the cooling fan 60, a forced cooling air 93 discharged to the outside from the top surface ventilation opening 30 without cooling the heating element 50 is generated other than a forced cooling air 92 that is used for cooling the heating element 50. That is, a part of the forced cooling air 91 at the time of forced cooling is leaked to the outside from the top surface ventilation opening 30, so that a sufficient air is not supplied to the part that is desired to be cooled down.

In order to overcome such issues of the related techniques 1 and 2, it is necessary to set a flow of cooling air suited for each of the cases of natural cooling and forced cooling. Thus, as mentioned in a last part of the section of "problem to be solved by the invention", an air-cooled case capable of automatically setting a flow of cooling air for each of the cases of natural cooling and forced cooling is presented as a following exemplary embodiment.

Figure 2:
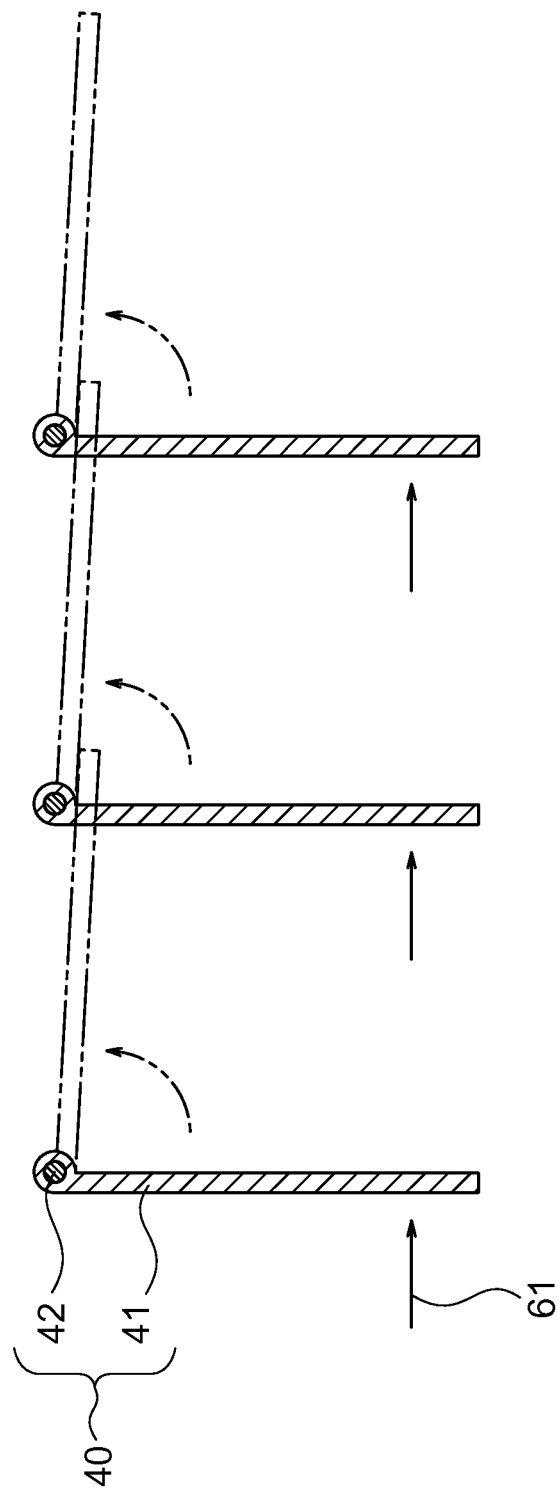
FIG. 2 is a fragmentary sectional view showing an enlarged view of a shutter shown in FIG. 1.
Figure 3:
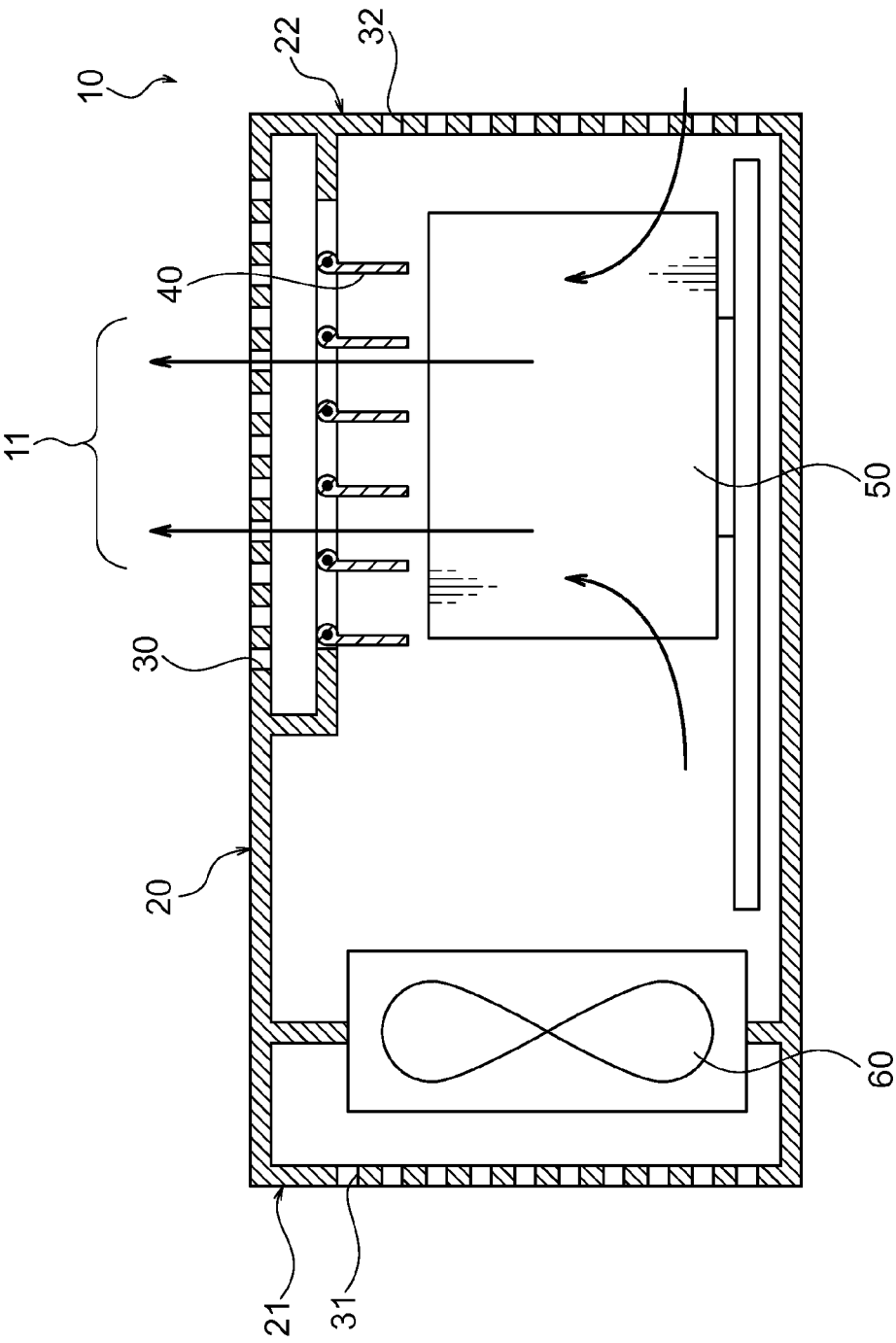
FIG. 3 is a sectional view showing a flow of natural cooling air in the air-cooled case according to the first exemplary embodiment.
Figure 4:
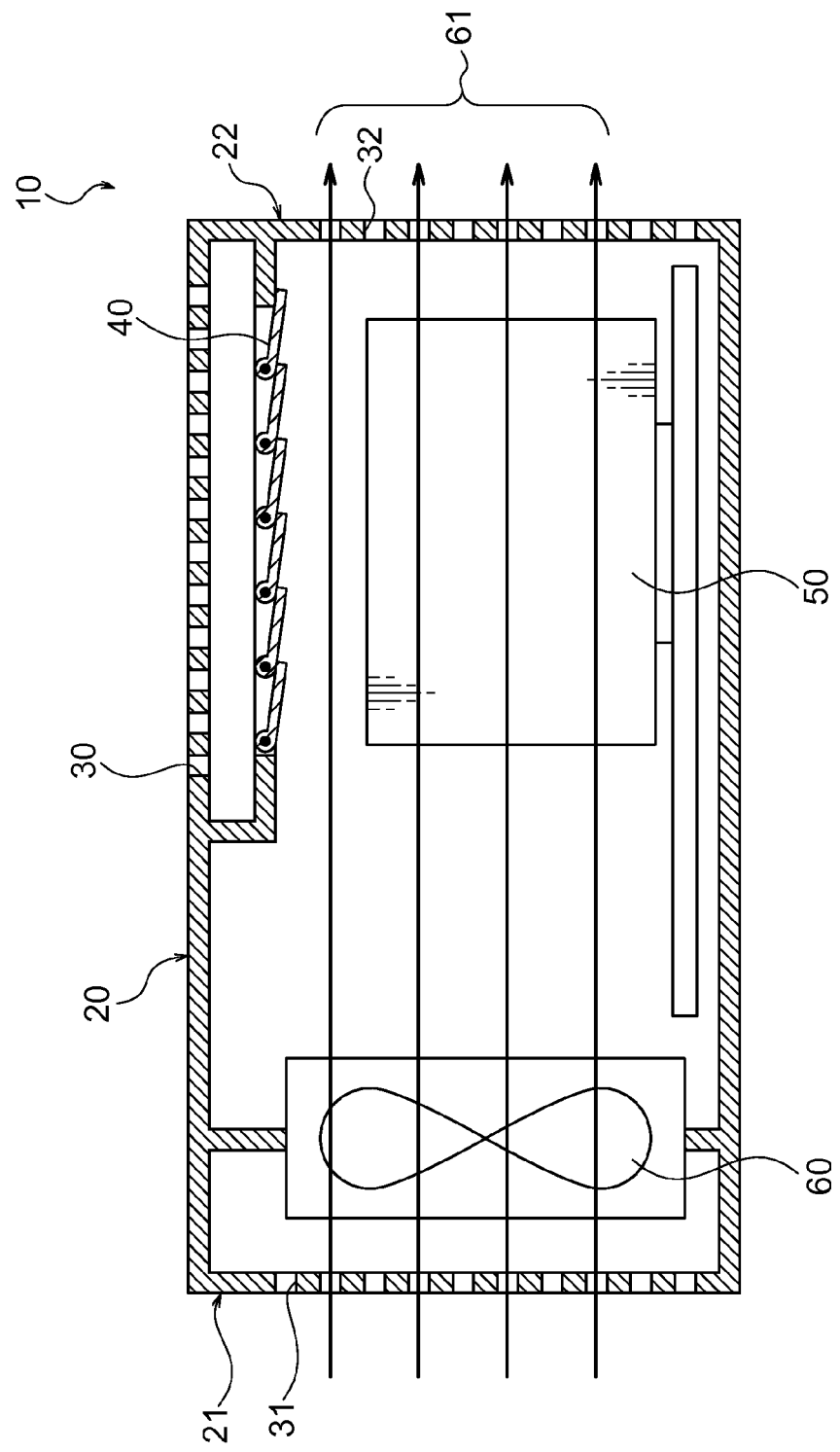
FIG. 4 is a sectional view showing a flow of forced cooling air in the air-cooled case according to the first exemplary embodiment.

FIG. 1 is a sectional view showing the air-cooled case of the first exemplary embodiment. FIG. 2 is a fragmentary sectional view showing an enlarged view of a shutter shown in FIG. 1. FIG. 3 is a sectional view showing a flow of natural cooling air in the air-cooled case of the first exemplary embodiment. FIG. 4 is a sectional view showing a flow of forced cooling air in the air-cooled case of the first exemplary embodiment. Hereinafter, explanations will be provided by referring to those drawings.

An air-cooled case 10 according to the exemplary embodiment houses a heating element 50 and a cooling fan 60 in a space surrounded by a plurality of surfaces including a top surface 20 and opposing side surfaces 21, 22. Further, the air-cooled case 10 includes a top surface ventilation opening 30 formed in the top surface 20, side surface ventilation openings 31, 32 formed in the side surfaces 21, 22, and a shutter 40 provided to the top surface ventilation opening 30 for opening and closing the top surface ventilation opening 30.

Specifically, the shutter 40 opens the top surface ventilation opening 30 by its own weight when there is no forced cooling air 61 generated by the cooling fan 60 and closes the top surface ventilation opening 30 by the pressure of the forced cooling air 61 when there is the forced cooling air 61 being generated.

With the exemplary embodiment, it is possible to automatically set the flow of cooling air suited for the case of natural cooling through opening the top surface ventilation opening 30 by the shutter 40 itself in the case of natural cooling and to automatically set the flow of cooling air suited for the case of forced cooling through closing the top surface ventilation opening 30 by the shutter 40 itself in the case of forced cooling.

It is desirable to form the top surface ventilation opening 30 right above the heating element 50. As shown in FIG. 3, a natural cooling air 11 entered from the side surface ventilation openings 31, 32 at the time of natural cooling is heated by the heating element 50 and moves upwards. Thus, when the top surface ventilation opening 30 is placed right above the heating element 50, the natural cooling air 11 warmed by the heating element 50 is discharged to the outside in the minimum distance. Therefore, it is possible to increase the cooling capacity at the time of natural cooling.

It is desirable to set the cooling fan 60 near the side surface ventilation opening 31 and to set the heating element 50 near the side surface ventilation opening 32. In that case, as shown in FIG. 4, the forced cooling air flows 61 from the side surface ventilation opening 31 to the side surface ventilation opening 32 in a straight-line form at the time of forced cooling. Therefore, the forced cooling air 61 warmed by the heating element 50 is promptly discharged to the outside, so that the cooling capacity at the time of forced cooling can be increased.

More specifically, the shutter 40 opens the top surface ventilation opening 30 by hanging down towards the heating element 50 side by its own weight when there is no forced cooling air 61, and closes the top surface ventilation opening 30 by being pushed upwards towards the top surface ventilation opening 30 by the pressure generated by having the forced cooling air 61 flown from the side surface ventilation opening 31 towards the side surface ventilation opening 32 when there is the forced cooling air 61.

As shown in FIG. 2, the shutter 40 includes: a plate part 41 which hangs down by its own weight and is pushed up by the pressure of the forced cooling air 61; and a shaft part 42 which rotatably supports the plate part 41. The plate part 41 is made with aluminum, for example.

The shape of the air-cooled case 10 is a cuboid shape, which includes a bottom surface and two side surfaces (reference numerals thereof are omitted) other than the top surface 20 and the side surfaces 21, 22. The top surface ventilation opening 30 and the side surface ventilation openings 31, 32 are constituted with a great number of small through-holes formed in the plates. The heating element 50 is an electronic component such as a CPU or a power source circuit, for example. In general, the electronic component is soldered on a printed circuit board.

Next, the air-cooled case 10 according to the exemplary embodiment will be described in more details.

Referring to FIG. 1, the air-cooled case 10 having the heating element 50 and the cooling fan 60 built inside thereof includes the side surface ventilation opening 31 as the aspiration opening formed in the side surface 21 that is the front surface and the side surface ventilation opening 32 as an exhaust opening or an aspiration opening in the side surface 22 that is the back surface, and it is designed to supply the forced cooling air 61 from the side surface 21 side towards the side surface 22 side by the cooling fan 60 disposed on the aspiration side. Further, the air-cooled case 10 includes the top surface ventilation opening 30 as an exhaust opening in the top surface 20 and the shutter 40 by covering the top surface ventilation opening 30. It is the best for the top surface ventilation opening 30 to be provided right above the heating element 50 by considering emission of the heat at the time of natural cooling.

As shown in FIG. 2, the shutter 40 includes the plate part 41 and the shaft part 42 for making it possible to be rotated by the wind force generated by the forced cooling air 61. It is best to use an aluminum thin plate as the plate part 41, since the plate part 41 can be easily rotated by the forced cooling air 61 when the weight thereof is as light as possible. It is best for the plate part 41 and the shaft part 42 to be fixed by caulking.

As shown in FIG. 3, when the cooling fan 60 is stopped at the time of natural cooling, the inside of the air-cooled case 10 becomes almost windless. Thus, the shutter 40 is rotated towards the heating element 50 side by its own weight by having the shaft part 42 (FIG. 2) as the center and opens the top surface ventilation opening 30. Thereby, the natural cooling air 11 as the exhaust from the heating element 50 is discharged to the outside from the top surface ventilation opening 30.

As shown in FIG. 4, when the cooling fan 60 is driven at the time of forced cooling, the shutter 40 is rotated towards the side surface 22 side by having the shaft part 42 (FIG. 2) as the center by the forced cooling air 61 generated therefrom and covers the top surface ventilation opening 30. Thereby, the forced cooling air 61 is discharged towards the outside from the side surface ventilation opening 32.

It is desirable for the cooling fan 60 to be in a structure with which the forced cooling air 61 is flown from the side surface 21 side towards the side surface 22 side. There is no limit set in the number of the fans, and it is possible to use not only an axial flow fan but also a blower fan. There is no specific limit in the material used for the shutter 40, as long as it can be rotated by the forced cooling air 61. Thus, a resin or the like can be employed as well. Further, there is no limit set for the number of the shutter 40. While the case of having one heating element 50 is described in the exemplary embodiment, there is no limit set for the number thereof.

Next, the effects of the air-cooled case 10 according to the exemplary embodiment can be summarized as follows.

The shutter 40 is rotated by the existence of the forced cooling air 61 generated by the cooling fan 60 and the top surface ventilation opening 30 is opened/closed. Thus, the flow of the natural cooling air 11 and the forced cooling air 61 can be switched, thereby making it possible to implement automatic switching of natural cooling and forced cooling.

It is possible to provide efficient natural cooling and forced cooling with one kind of air-cooled case 10. The reason thereof is that the flow of the natural cooling air 11 and the forced cooling air 61 can be switched by the existence of the forced cooling air 61. In electronic apparatuses which consume the large power under a standby state, it is possible to select natural cooling where the cooling fan 60 is not driven under the standby state without deteriorating the cooling efficiency of the forced cooling under an operation state. The reason thereof is that the top surface ventilation opening 30 can be opened/closed by the shutter 40 rotated by the existence of the forced cooling air 61, so that it is possible to switch the flow of cooling air suited for each of the forced cooling and the natural cooling.

At the time of forced cooling, leak of the forced cooling air 61 can be prevented through blocking the top surface ventilation opening 30 by the shutter 40 energized by the forced cooling air 61. Thus, the forced cooling air 61 can be blown to the heating element 50 efficiently. Since efficient natural cooling can be achieved in the electronic apparatuses which consume large power under the standby state, drive of the cooling fan 60 can be suppressed. Since the increase in the temperature of the heating element 50 can be suppressed by the efficient natural cooling in the electronic apparatuses which consume large power under the standby state, the reliability of the heating element 50 can be improved. Through providing the top surface ventilation opening 30 having the shutter 40 above the heating element 50 such as the CPU or the power source unit, it is possible to change the flow of the cooling air for the cases of natural cooling and the forced cooling to as to achieve efficient cooling.

While the present invention has been described above by referring to the embodiments, the present invention is not limited only to the embodiments described above. Various changes and modifications occurred to those skilled in the art can be applied to the structures and the details of the present invention. Further, it is to be noted that the present invention includes combinations of a part of or the whole part of the structures of the embodiments combined mutually in an appropriate manner.

While a part of or a whole part of the embodiments can be summarized as follows, the present invention is not limited only to the following structures.

(Supplementary Note 1)

An air-cooled case which houses a heating element and a cooling fan in a space surrounded by a plurality of surfaces including a top surface, and the air-cooled case includes:

a top surface ventilation opening formed in the top surface;

ventilation openings formed in some of the plurality of surfaces; and a shutter which is provided in the top surface ventilation opening and opens/closes the top surface ventilation opening, wherein the shutter opens the top surface ventilation opening by its own weight when there is no forced cooling air generated by the cooling fan, and closes the top surface ventilation opening by a pressure of the forced cooling air when there is the forced cooling air.

(Supplementary Note 2)

The air-cooled case as depicted in Supplementary Note 1, wherein the top surface ventilation opening is formed right above the heating element.

(Supplementary Note 3)

The air-cooled case as depicted in Supplementary Note 2, wherein the ventilation openings are a first side surface ventilation opening and a second side surface ventilation opening formed in opposing side surfaces among the plurality of surfaces.

(Supplementary Note 4)

The air-cooled case as depicted in Supplementary Note 3, wherein:

the cooling fan is placed near the first side surface ventilation opening; and the heating element is placed near the second side surface ventilation opening.

(Supplementary Note 5)

The air-cooled case as depicted in Supplementary Note 4, wherein the shutter opens the top surface ventilation opening by hanging down on the heating element side by its own weight when there is no forced cooling air, and closes the top surface ventilation opening by being pushed up to the top surface ventilation opening side by a pressure of the forced cooling air flown from the first side surface ventilation opening towards the second side surface ventilation opening when there is the forced cooling air.

(Supplementary Note 6)

The air-cooled case as depicted in Supplementary Note 5, wherein the shutter includes: a plate part which hangs down by its own weight and is pushed up by the pressure of the forced cooling air; and a shaft part which rotatably supports the plate part.

(Supplementary Note 7)

The air-cooled case as depicted in Supplementary Note 6, wherein the plate part is made with aluminum.

(Supplementary Note 8)

The air-cooled case as depicted in any one of Supplementary Notes 1 to 7, wherein the heating element is an electronic component.

(Supplementary Note 9)

A case structure in an air-cooled case, which includes:

a cooling fan on a front side of the case; and a structure which is formed on a top plate and opened/closed by a cooling air.

(Supplementary Note 10)

A case structure in an air-cooled case, which enables automatic switching of forced cooling and natural cooling by the existence of a cooling air.

(Supplementary Note 11)

A case structure in an air-cooled case, which is capable of changing an air flow by the existence of a cooling air.

This application claims the Priority right based on Japanese Patent Application No. 2012-101619 filed on Apr. 26, 2012 and the disclosure thereof is hereby incorporated by reference in its entirety.

INDUSTRIAL APPLICABILITY

As an example of the practical use of the present invention, the present invention can be applied to products in which cooling of heating elements thereof is achieved by air cooling.

REFERENCE NUMERALS

10 Air-cooled case
11 Natural cooling air
20 Top surface
21 Side surface
22 Side surface
30 Top surface ventilation opening
31 Side surface ventilation opening (ventilation opening, first side surface ventilation opening)
32 Side surface ventilation opening (ventilation opening, second side surface ventilation opening)
40 Shutter
41 Plate part
42 Shaft part
50 Heating element
60 Cooling fan
61 Forced cooling air
80 Air-cooled case
81 Natural cooling air
90 Air-cooled case
91 Forced cooling air
92 Forced cooling air
93 Forced cooling air

The invention claimed is:

1. An air-cooled case which houses a heating element and a cooling fan in an enclosed space, the air-cooled case comprising:

a top surface;

two side surfaces opposing each other, the top surface arranged between said two side surfaces a top surface ventilation opening, formed in the top surface and located directly above the heating element;

a first side surface ventilation opening and a second side surface ventilation opening respectively formed in a first of the two side surfaces and a second of the two side surfaces; and a plurality of shutters provided in the top surface ventilation opening which alternately open and close the top surface ventilation opening, wherein ventilation openings are provided to only the top and two side surfaces of the air-cooled case, wherein each of the plurality of shutters independently opens the top surface ventilation opening by its own weight when there is no forced cooling air generated by the cooling fan, and independently closes the top surface ventilation opening by a pressure of the forced cooling air when there is the forced cooling air.

2. The air-cooled case as claimed in claim 1, wherein:

the cooling fan is placed near the first side surface ventilation opening; and the heating element is placed near the second side surface ventilation opening.

3. The air-cooled case as claimed in claim 2, wherein the shutter opens the top surface ventilation opening by hanging down on the heating element side by its own weight when there is no forced cooling air, and closes the top surface ventilation opening by being pushed up to the top surface ventilation opening side by a pressure of the forced cooling air flown from the first side surface ventilation opening towards the second side surface ventilation opening when there is the forced cooling air.

4. The air-cooled case as claimed in claim 3, wherein the shutter comprise: a plate part which hangs down by its own weight and is pushed up by the pressure of the forced cooling air; and a shaft part which rotatably supports the plate part.

5. The air-cooled case as claimed in claim 4, wherein the plate part is made with aluminum.

6. The air-cooled case as claimed in claim 1, wherein the heating element is an electronic component.

7. The air-cooled case as claimed in claim 2, wherein the heating element is an electronic component.

8. The air-cooled case as claimed in claim 3, wherein the heating element is an electronic component.

\* \* \* \* \*